(12) United States Patent
Streefkerk et al.

(10) Patent No.: US 9,104,117 B2
(45) Date of Patent: Aug. 11, 2015

(54) LITHOGRAPHIC APPARATUS HAVING A LIQUID DETECTION SYSTEM

(71) Applicants: Bob Streefkerk, Tilburg (NL); Johannes Jacobus Matheus Baselmans, Oirschot (NL); Sjoerd Nicolaas Lambertus Donders, Vught (NL); Christiaan Alexander Hoogendam, Westerhoven (NL); Jeroen Johannes Sophia Maria Mertens, Knegsel (NL); Johannes Catharinus Hubertus Mulkens, Valkenswaard (NL)

(72) Inventors: Bob Streefkerk, Tilburg (NL); Johannes Jacobus Matheus Baselmans, Oirschot (NL); Sjoerd Nicolaas Lambertus Donders, Vught (NL); Christiaan Alexander Hoogendam, Westerhoven (NL); Jeroen Johannes Sophia Maria Mertens, Knegsel (NL); Johannes Catharinus Hubertus Mulkens, Valkenswaard (NL)

( * ) Notice: Subject to any disclaimer, the term of this patent is extended or adjusted under 35 U.S.C. 154(b) by 0 days.

(21) Appl. No.: 13/685,410

(22) Filed: Nov. 26, 2012

(65) Prior Publication Data

US 2013/0135595 A1    May 30, 2013

Related U.S. Application Data

(63) Continuation of application No. 12/289,591, filed on Oct. 30, 2008, now Pat. No. 8,319,939, which is a continuation of application No. 10/885,489, filed on Jul. 7, 2004, now Pat. No. 7,463,330.

(51) Int. Cl.
*G03F 7/20*    (2006.01)
*G03F 9/00*    (2006.01)

(52) U.S. Cl.
CPC ........ *G03F 7/70341* (2013.01); *G03F 7/70866* (2013.01); *G03F 9/7026* (2013.01); *G03F 9/7034* (2013.01)

(58) Field of Classification Search
CPC .. G03F 7/70916; G03F 9/7026; G03F 9/7034
USPC .................................... 355/30, 53
See application file for complete search history.

(56) References Cited

U.S. PATENT DOCUMENTS

| | | | |
|---|---|---|---|
| 3,573,975 A | 4/1971 | Dhaka et al. |
| 3,648,587 A | 3/1972 | Stevens |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,528,118 A | 6/1996 | Lee |
| 5,610,683 A | 3/1997 | Takahashi |
| 5,623,853 A | 4/1997 | Novak et al. |
| 5,715,039 A | 2/1998 | Fukuda et al. |
| 5,825,043 A | 10/1998 | Suwa |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

"Level sensor", 2013, Wikipedia, http://en.wikipedia.org/wiki/Level_sensor.*

(Continued)

*Primary Examiner* — Chia-How Michael Liu

(57) ABSTRACT

In immersion lithography after exposure of a substrate is complete, a detector is used to detect any residual liquid remaining on the substrate and/or substrate table.

21 Claims, 3 Drawing Sheets

(56) References Cited

U.S. PATENT DOCUMENTS

| | | |
|---|---|---|
| 5,874,820 A | 2/1999 | Lee |
| 5,900,354 A | 5/1999 | Batchelder |
| 5,969,441 A | 10/1999 | Loopstra et al. |
| 6,191,429 B1 | 2/2001 | Suwa |
| 6,208,407 B1 | 3/2001 | Loopstra |
| 6,236,634 B1 | 5/2001 | Lee et al. ............... 369/112 |
| 6,341,007 B1 | 1/2002 | Nishi et al. |
| 6,400,441 B1 | 6/2002 | Nishi et al. |
| 6,417,914 B1 | 7/2002 | Li |
| 6,549,269 B1 | 4/2003 | Nishi et al. |
| 6,560,032 B2 | 5/2003 | Hatano |
| 6,590,634 B1 | 7/2003 | Nishi et al. |
| 6,600,547 B2 | 7/2003 | Watson et al. |
| 6,603,130 B1 | 8/2003 | Bisschops et al. |
| 6,633,365 B2 | 10/2003 | Suenaga |
| 6,954,256 B2 | 10/2005 | Flagello et al. |
| 7,070,915 B2 | 7/2006 | Ho |
| 7,394,521 B2 | 7/2008 | Van Santen et al. |
| 7,990,517 B2 | 8/2011 | Takaiwa |
| 7,995,186 B2 | 8/2011 | Ohta |
| 2002/0020821 A1 | 2/2002 | Van Santen et al. ......... 250/492 |
| 2002/0163629 A1 | 11/2002 | Switkes et al. |
| 2003/0030916 A1 | 2/2003 | Suenaga |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0020782 A1 | 2/2004 | Cohen et al. |
| 2004/0021844 A1 | 2/2004 | Suenaga |
| 2004/0075895 A1 | 4/2004 | Lin |
| 2004/0103950 A1 | 6/2004 | Iriguchi |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | De Smit et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094119 A1 | 5/2005 | Loopstra et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Zaal et al. |
| 2005/0225735 A1 | 10/2005 | Magome et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259236 A1 | 11/2005 | Straaijer |
| 2005/0264774 A1 | 12/2005 | Mizutani et al. |
| 2005/0264778 A1 | 12/2005 | Lof et al. |
| 2005/0270505 A1 | 12/2005 | Smith |
| 2006/0007419 A1 | 1/2006 | Streefkerk |
| 2006/0077367 A1 | 4/2006 | Kobayashi et al. |
| 2006/0119813 A1 | 6/2006 | Hultermans et al. |
| 2006/0132737 A1 | 6/2006 | Magome et al. |
| 2006/0257553 A1 | 11/2006 | Ohta et al. |
| 2007/0159609 A1 | 7/2007 | Takaiwa et al. |
| 2007/0258068 A1 | 11/2007 | Horikawa |
| 2011/0261330 A1 | 10/2011 | Ohta et al. |
| 2011/0261331 A1 | 10/2011 | Takaiwa et al. |
| 2011/0261345 A1 | 10/2011 | Takaiwa et al. |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 57-117238 | 7/1982 |
| JP | 57-153433 | 9/1982 |
| JP | 58-202448 | 11/1983 |
| JP | 59-019912 | 2/1984 |
| JP | 62-065326 | 3/1987 |

(56) References Cited

FOREIGN PATENT DOCUMENTS

| | | |
|---|---|---|
| JP | 62-121417 | 6/1987 |
| JP | 63-157419 | 6/1988 |
| JP | 63-73628 | 9/1989 |
| JP | 04-065603 | 3/1992 |
| JP | 04-305915 | 10/1992 |
| JP | 04-305917 | 10/1992 |
| JP | 05-062877 | 3/1993 |
| JP | 06-053120 | 2/1994 |
| JP | 06-124873 | 5/1994 |
| JP | 06-168866 | 6/1994 |
| JP | 06-188169 | 7/1994 |
| JP | 07-066114 | 3/1995 |
| JP | 07-132262 | 5/1995 |
| JP | 07-176468 | 7/1995 |
| JP | 07-220990 | 8/1995 |
| JP | 08-037149 | 2/1996 |
| JP | 08-166475 | 6/1996 |
| JP | 08-213310 | 8/1996 |
| JP | 08-316125 | 11/1996 |
| JP | 08-330224 | 12/1996 |
| JP | 63-073628 | 4/1998 |
| JP | 10-163099 | 6/1998 |
| JP | 10-214783 | 8/1998 |
| JP | 10-228661 | 8/1998 |
| JP | 10-255319 | 9/1998 |
| JP | 10-303114 | 11/1998 |
| JP | 10-340846 | 12/1998 |
| JP | 11-016816 | 1/1999 |
| JP | 11-135400 | 5/1999 |
| JP | 11-176727 | 7/1999 |
| JP | 2000-058436 | 2/2000 |
| JP | 2001-091849 | 4/2001 |
| JP | 2002-014005 | 1/2002 |
| JP | 2003-077828 | 3/2003 |
| JP | 2003-234265 | 8/2003 |
| JP | 2004-134461 | 4/2004 |
| JP | 2004-193252 | 7/2004 |
| JP | 2004-207696 | 7/2004 |
| JP | 2005-005713 | 1/2005 |
| JP | 2005-012195 | 1/2005 |
| JP | 2005-057278 | 3/2005 |
| JP | 2005-259789 | 9/2005 |
| WO | 98/28665 | 7/1998 |
| WO | WO 99/49504 | 9/1999 |
| WO | 02/091078 A1 | 11/2002 |
| WO | WO 03/077036 | 9/2003 |
| WO | WO 03/077037 | 9/2003 |
| WO | WO 2004/019128 | 3/2004 |
| WO | 2004/050266 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | 2004/077154 | 9/2004 |
| WO | 2004/081666 | 9/2004 |
| WO | 2004/090577 | 10/2004 |
| WO | 2004/090633 | 10/2004 |
| WO | 2004/090634 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004/095135 | 11/2004 |
| WO | 2004/105106 | 12/2004 |
| WO | 2004/105107 | 12/2004 |
| WO | 2005/001432 | 1/2005 |
| WO | 2005/001572 | 1/2005 |
| WO | 2005/003864 | 1/2005 |
| WO | 2005/006026 | 1/2005 |
| WO | 2005/008339 | 1/2005 |
| WO | 2005/010962 | 2/2005 |
| WO | 2005/013008 | 2/2005 |
| WO | 2005/015283 | 2/2005 |
| WO | 2005/017625 | 2/2005 |
| WO | 2005/019935 | 3/2005 |
| WO | 2005/022266 | 3/2005 |
| WO | 2005/024325 | 3/2005 |
| WO | 2005/024517 | 3/2005 |
| WO | 2005/034174 | 4/2005 |
| WO | 2005/036621 | 4/2005 |
| WO | 2005/050324 | 6/2005 |
| WO | 2005/054953 | 6/2005 |
| WO | 2005/054955 | 6/2005 |
| WO | 2005/059617 | 6/2005 |
| WO | 2005/059618 | 6/2005 |
| WO | 2005/059645 | 6/2005 |
| WO | 2005/059654 | 6/2005 |
| WO | 2005/062128 | 7/2005 |
| WO | 2005/064400 | 7/2005 |
| WO | 2005/064405 | 7/2005 |
| WO | 2005/069055 | 7/2005 |
| WO | 2005/069078 | 7/2005 |
| WO | 2005/069081 | 7/2005 |
| WO | 2005/071491 | 8/2005 |
| WO | 2005/074606 | 8/2005 |
| WO | 2005/076084 | 8/2005 |
| WO | 2005/076321 | 8/2005 |
| WO | 2005/081030 | 9/2005 |
| WO | 2005/081067 | 9/2005 |
| WO | 2005/081293 | 9/2005 |
| WO | 2005/098504 | 10/2005 |
| WO | 2005/098505 | 10/2005 |
| WO | 2005/098506 | 10/2005 |
| WO | 2005/106589 | 11/2005 |
| WO | 2005/111689 | 11/2005 |
| WO | 2005/111722 | 11/2005 |
| WO | 2005/119368 | 12/2005 |
| WO | 2005/119369 | 12/2005 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges-for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl.

(56) References Cited

OTHER PUBLICATIONS

Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\Lambda$/NA scaling equations for resolution, depth of focus, and immersion lithography, *J. Microlith., Microfab., Microsyst.* 1(1):7-12 (2002).

Information Disclosure Statement filed Jan. 10, 2007 issued for U.S. Appl. No. 11/651,551.

Information Disclosure Statement filed Jan. 11, 2007 issued for U.S. Appl. No. 11/652,015.

B.J. Lin, "Semiconductor Foundry, Lithography and Partners," Proceedings of SPEI, vol. 4688, 2002, pp. 11-24.

M. Switkes, et al., "Resolution Enhancement of 157 nm Lithography by Liquid Immersion," Proceedings of SPEI, vol. 4691, 2002, pp. 459-465.

M. Switkes, et al., "Resolution Enhancement of 157 nm Lithography by Liquid Immersion," J. Microlith., Microfab, Microsyst., vol. 1, No. 3, Oct. 2002, pp. 225-228.

Soichi Owa et al., "Immersion lithography; its potential performance and issues," Optical Microlithography XVI, Proceedings of SPIE, vol. 5040, 2003, pp. 724-733.

Office Action as issued for U.S. Appl. No. 13/067,867 mailed Feb. 28, 2012.

Office Action as issued for U.S. Appl. No. 13/067,842 mailed Mar. 2, 2012.

English Translation of Japanese Official Action issued Oct. 2, 2008 in Japanese Application No. 2005-197421.

English translation of the Official Action issued Dec. 7, 2009 by the Japanese Patent Office in Japanese Patent Application No. 2009-000117 (3 pages).

Japanese Office Action mailed Oct. 18, 2011 in corresponding Japanese Patent Application No. 2010-088441.

JP 2003-234265 Yamazaki translation.

\* cited by examiner

LITHOGRAPHIC APPARATUS HAVING A LIQUID DETECTION SYSTEM

The present application is a continuation of U.S. patent application Ser. No. 12/289,591, filed on Oct. 30, 2008, now allowed, which is a continuation of U.S. patent application Ser. No. 10/885,489, filed on Jul. 7, 2004, now U.S. Pat. No. 7,463,330, the entire contents of each of the foregoing applications herein fully incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. The effect of the liquid may also be regarded as increasing the effective numerical aperture (NA) of the system and also increasing the depth of focus. Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

After exposure of a substrate using an immersion apparatus, there is a chance that immersion liquid, e.g. water, will remain on the substrate and/or the substrate table. Such residual liquid can cause various problems—liquid on the substrate may cause errors in subsequent processing of the substrate, e.g. due to temperature non-uniformities in the post exposure bake, while liquid on the substrate table, especially on sensors and fiducial marks, may cause errors in subsequent measurements—and so is undesirable.

SUMMARY

Accordingly, it may be advantageous, for example, to prevent or reduce the occurrence of residual liquid on the substrate and/or substrate table after exposure of a substrate in an immersion type lithographic apparatus.

According to an aspect of the invention, there is provided a lithographic projection apparatus comprising a substrate table configured to hold a substrate; a projection system arranged to project a patterned beam of radiation onto the substrate; a liquid supply system configured to supply liquid to a space between the projection system and the substrate; and a residual liquid detector configured to detect liquid remaining on the substrate and/or the substrate table after an exposure is completed.

In an embodiment of the invention, the apparatus further comprises a drying station configured to dry the substrate, the substrate table or both in the event that liquid is detected by the residual liquid detector.

In an embodiment of the invention, the residual liquid detector comprises a level sensor configured to measure the position of a surface in a direction substantially parallel to an optical axis of the projection system, a tilt of a surface about axes substantially perpendicular to the optical axis of the projection system, or both.

In an embodiment of the invention, the residual liquid detector comprises an alignment sensor configured to measure the position of a marker in a direction substantially perpendicular to an optical axis of the projection system.

In the foregoing two embodiments, detection of liquid on the substrate, substrate table, or both may be effected by the level and/or alignment sensor giving a measurement outside a normal operating range.

In a further embodiment, the residual liquid detector comprises one or more devices selected from the group comprising an air gauge, a capacitive sensor, an automatically focusing spot projector, a scatterometer, a camera, an infrared sensor, and a grazing angle laser beam and a detector to detect scattered light.

In yet a further embodiment of the invention, the residual liquid detector comprises a monitoring circuit configured to monitor a force applied by an actuator to maintain the substrate table at a constant vertical position.

A further aspect of the invention provides a device manufacturing method comprising projecting, using a projection system of a lithographic apparatus, a patterned beam of radiation through a liquid onto a substrate, the substrate being held by a substrate table, and, after the projecting is complete, detecting residual liquid on the substrate and/or the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
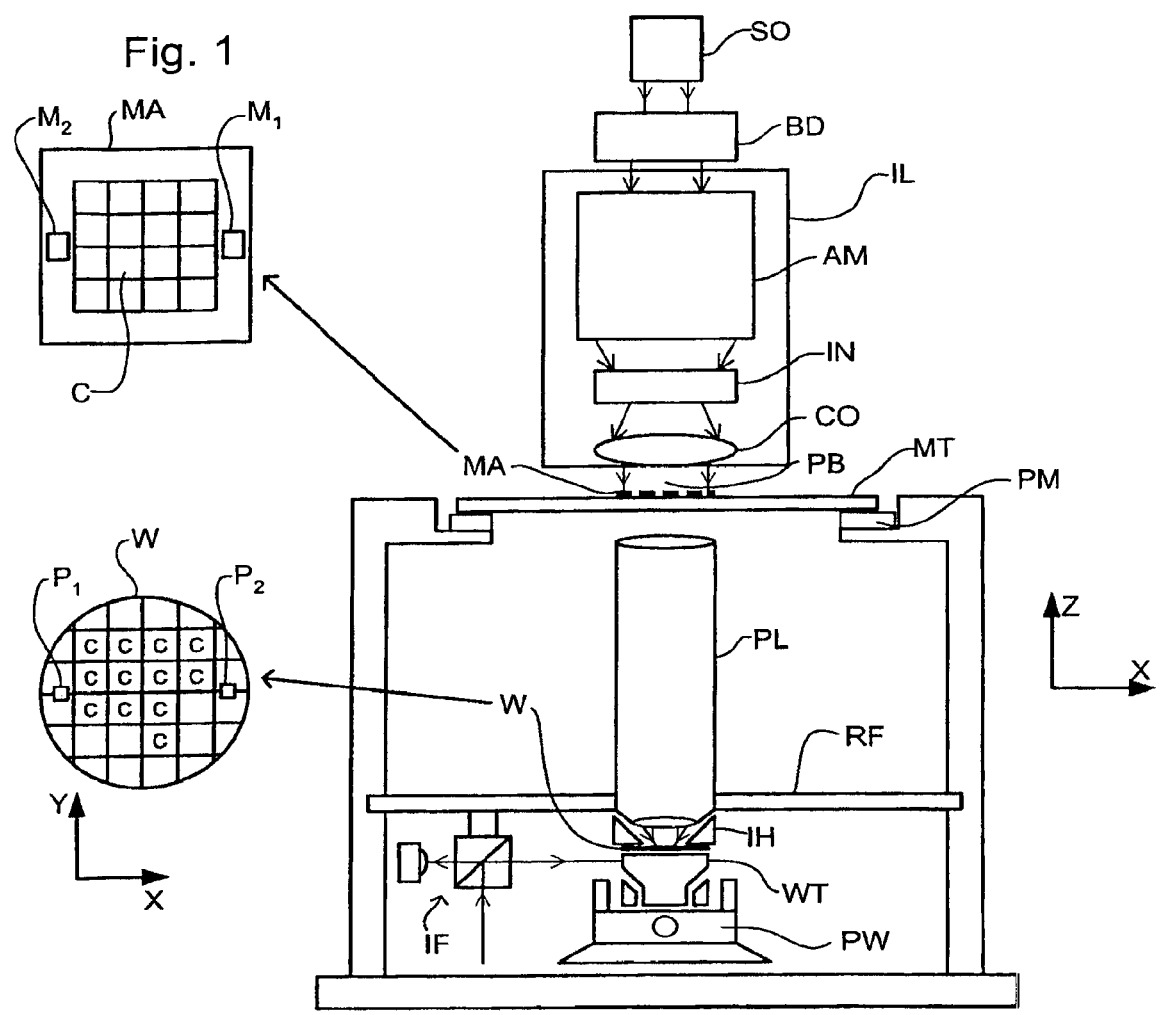
FIG. 1 depicts a lithographic apparatus according to an embodiment of the invention.
Figure 2:
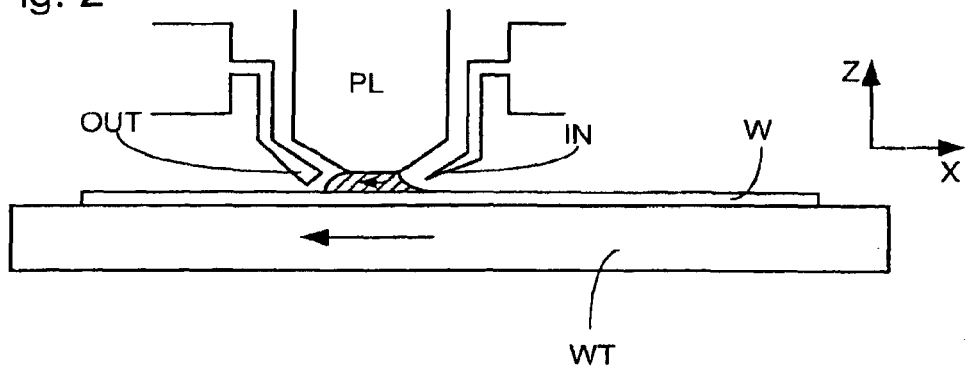
FIGS. 2 and 3 depict a liquid supply system for a lithographic projection apparatus.
Figure 3:
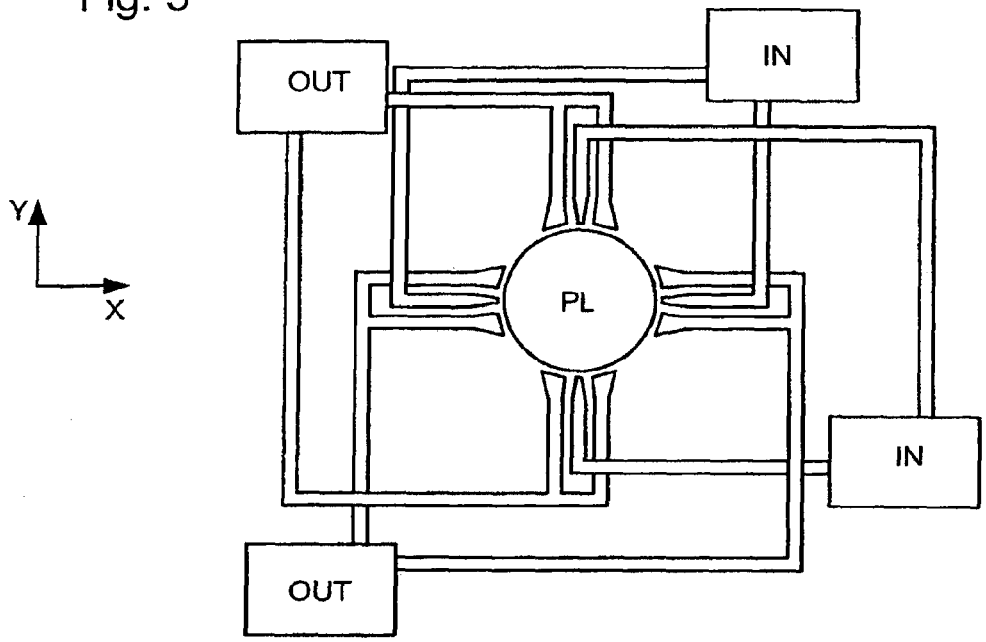

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device.

Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Another liquid supply system which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference.

Figure 5:
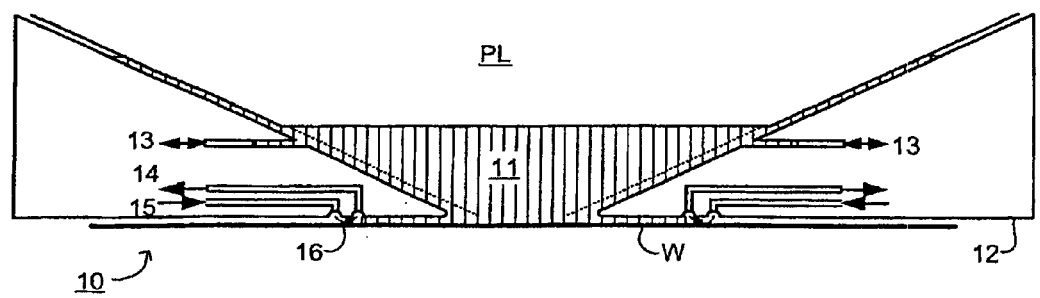
FIG. 5 depicts a liquid supply system according to an embodiment of the invention.

FIG. 5 depicts a liquid supply system comprising a liquid reservoir 10 between the projection system and the substrate stage. The liquid reservoir 10 is filled with a liquid 11 having a relatively high refractive index, e.g. water, provided via inlet/outlet ducts 13. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

The reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end preferably closely conforms to the step of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air but preferably $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity gas flow inwards that confines the liquid. Alternatively, a liquid seal, in which a liquid flow is set up to confine the liquid in the reservoir, may be used.

In an implementation, the gas seal is formed by two annular grooves which are connected to the first inlet 15 and first outlet 14 respectively by a series of small conducts spaced around the grooves. The in- and out-lets 14, 15 may either be a plurality of discrete orifices around the circumference of the seal member 12 or may be continuous grooves or slits. A large annular hollow in the seal member may be provided in each of the inlet and outlet to form a manifold. The gas seal may also be effective to support the seal member 12 by behaving as a gas bearing. A liquid seal may also act as a dynamic or static bearing.

Figure 6:
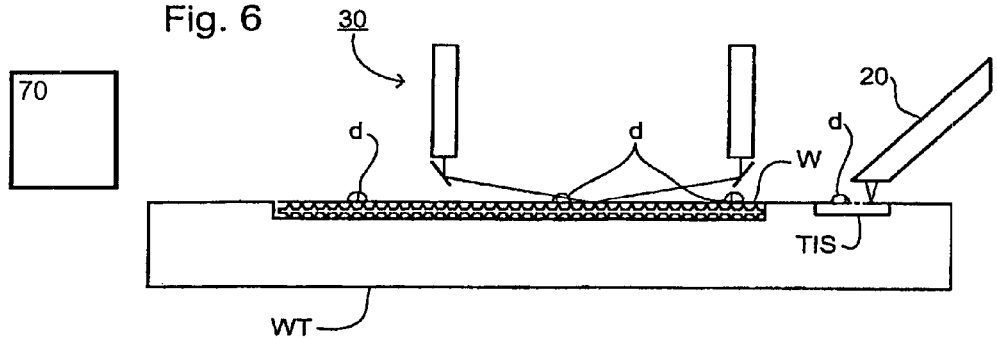
FIGS. 6 to 8 depict measurement devices and sensors at a measurement station in different embodiments of the invention.

At a measurement station in the lithographic apparatus, various sensors and measurement devices are provided for use in preparing a substrate for exposure and/or qualifying an exposed resist. Some of these are shown in FIG. 6. A substrate W is loaded onto a substrate table WT at the measurement station (or at a further load/unload station) and any necessary pre-exposure measurements are taken, for example a level sensor 30 is used to generate a height map of the entire substrate for later use in leveling the substrate during exposure and an alignment sensor 20 is used to measure the positions of alignment markers on the substrate W relative to a reference marker incorporated in a transmission image sensor TIS mounted on the substrate table WT. The substrate table WT and substrate W are then moved to an exposure station for exposure(s) to be completed and then returned to the measurement station for any necessary post-exposure measurements. To improve throughput, the apparatus may have a second substrate table so that exposures can be carried out on one substrate while another is being measured. If the apparatus has only one substrate table, the measurement devices and sensors can be provided at the exposure station and some measurements, e.g. leveling, may be performed concurrently with exposure.

In an embodiment of the invention, a post-exposure qualification process comprises detection of any residual liquid left on the substrate and/or substrate table after exposure has been completed. The liquid supply system is arranged as far as possible to remove all liquid that is used for the exposure but it is possible that some liquid will be left behind. Liquid on the substrate can cause difficulties in subsequent substrate processing, e.g. by causing temperature variations in a post-exposure bake process. The vapor arising from any residual liquid may also corrode the bake plates used for the post-exposure bake. Any residual liquid on the substrate table may also cause corrosion or may interfere with the operation of sensors such as the alignment sensor when attempting to determine the position of the reference marker. Residual liquid that might migrate over the sides of the substrate table onto the mirrors for the interferometric position measuring system may cause errors in the output of that system. Residual liquid is shown in FIG. 6 as droplets d but may also take the form of a thin film.

One method of detecting residual liquid on the substrate and/or substrate table is to perform a height mapping process with the level sensor 30. The presence of residual liquid may be indicated by height and/or tilt measurements outside a normal operating range of the sensor or by significant variation from a reference height map or a height map performed before exposure. Residual liquid may also be detected by performing alignment measurements with the alignment sensor 20. Again, measurements outside a normal operating range of the sensor or significant variation from measurements taken before exposure may be indicative of residual liquid.

In the event residual liquid is detected, an alarm signal may be generated to instruct an operator to take manual remedial action. Alternatively, an integral automated drying system 70 may be activated, or re-activated if a drying process has already been performed. If the residual liquid is detected on the substrate, the substrate may be unloaded to a track unit in the normal manner but accompanied by an error code or flag to instruct the track unit to perform an additional drying step, e.g. spin drying, before a post-exposure bake or other process sensitive to the presence of liquid.

Figure 7:
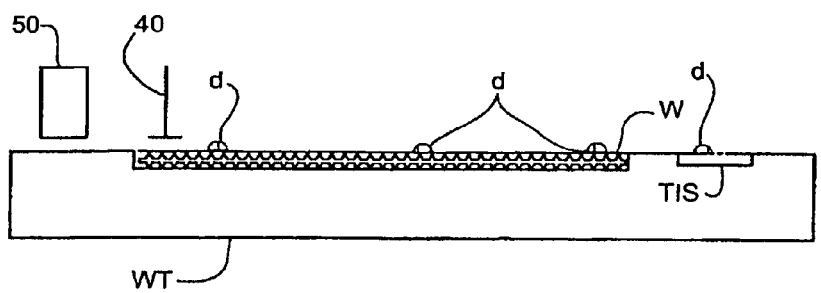
Figure 8:
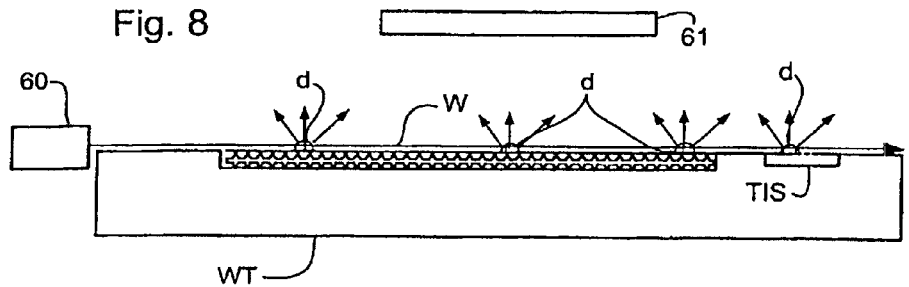

In another embodiment, a dedicated liquid detector is used to detect the residual liquid. This may take the form of a capacitive sensor 40 and/or an air gauge 50 as shown in FIG. 7. Other possible types of sensor comprise scatterometers, cameras, e.g. CCD cameras, infrared sensors to detect spots that are cooler due to evaporation, and known sensors for detecting particles on substrates. An automatically focusing spot projector may also be used. Such a device is often found in a pickup for a CD or other optical disk drive and comprises a collimating lens mounted in a voice coil to focus a collimated beam onto a substrate. The reflected beam is directed to a detector, e.g. a quad cell photodetector, which detects whether the spot on the substrate is in focus, e.g. by detecting the elipticity of the reflected beam. A servo circuit then adjusts the position of the collimating lens to bring the spot on the substrate in focus. The presence of liquid on the substrate will change the optical path length between lens and substrate so that the lens will be moved to compensate. This movement can be detected, e.g. by monitoring the drive signal to the voice coil, to indicate the presence of liquid. Such a device may be advantageous in that the beam spot projected on the substrate can be very small, e.g. diffraction limited, and hence very small liquid droplets may be detected. Referring to FIG. 8, an other possible type of sensor comprises a laser emitter 60 and a photodetector 61 to detect light scattered by the residual liquid.

The substrate table may be scanned past the detector or the detector may be provided on a robot arm to scan the substrate and/or substrate table. In the case of an emitter/detector sensor, the emitted beam may be arranged to scan across the substrate, e.g. using a rotating polygon mirror. Multiple detectors may be provided to reduce the time taken for the detection of residual liquid or for use over different parts of the substrate and substrate table surface.

It should be appreciated that the sensor or sensors for detecting residual liquid may be provided at the exposure station, especially if the apparatus is a single stage apparatus, and may operate in parallel with exposure(s) (i.e., detecting liquid at previously exposed target portions) or after all exposures have been completed. If sufficiently compact, the sensor or sensors may be mounted on the liquid supply system.

In a further embodiment, the detection of residual liquid is effected by detecting the additional weight of the residual liquid on the substrate table. This can be done by a circuit or software routine that monitors the force, applied to the substrate table by a Z-actuator or gravity compensator in order to maintain it at a constant vertical position.

In an embodiment, there is provided a lithographic projection apparatus comprising: a substrate table configured to hold a substrate; a projection system arranged to project a patterned beam of radiation onto the substrate; a liquid supply system configured to supply liquid to a space between the projection system and the substrate; and a residual liquid detector configured to detect liquid remaining on the substrate and/or the substrate table after an exposure is completed.

In an embodiment, the apparatus further comprises a drying station configured to dry the substrate, the substrate table, or both in the event that liquid is detected by the residual liquid detector. In an embodiment, the residual liquid detector comprises a level sensor configured to measure the position of a surface in a direction substantially parallel to an optical axis of the projection system, a tilt of a surface about axes substantially perpendicular to the optical axis of the projection system, or both. In an embodiment, detection of liquid on the substrate, substrate table, or both is effected by the level sensor giving a measurement outside a normal operating range. In an embodiment, the residual liquid detector comprises an alignment sensor configured to measure the position of a marker in a direction substantially perpendicular to an optical axis of the projection system. In an embodiment, detection of liquid on the substrate, substrate table, or both is effected by the alignment sensor giving a measurement outside a normal operating range. In an embodiment, the residual liquid detector comprises one or more devices selected from the group comprising an air gauge, a capacitive sensor, an automatically focusing spot projector, a scatterometer, a camera, an infrared sensor, and a grazing angle laser beam and a detector to detect scattered light. In an embodiment, the residual liquid detector comprises a monitoring circuit configured to monitor a force applied by an actuator to maintain the substrate table at a constant vertical position. In an embodiment, the projection system is provided at an exposure station and the residual liquid detector is provided at a measurement station, the measurement station being physically separate from the exposure station. In an embodiment, the residual liquid detector is configured to generate, upon detection of residual liquid, an alarm or error signal to instruct performance of a drying action.

In an embodiment, there is provided a device manufacturing method comprising projecting, using a projection system of a lithographic apparatus, a patterned beam of radiation through a liquid onto a substrate, the substrate being held by a substrate table, and, after the projecting is complete, detecting residual liquid on the substrate and/or the substrate table.

In an embodiment, the method further comprises drying the substrate, the substrate table, or both in the event that residual liquid is detected. In an embodiment, detecting residual liquid comprises measuring the position of a surface in a direction substantially parallel to an optical axis of the projection system, a tilt of a surface about axes substantially perpendicular to the optical axis of the projection system, or both. In an embodiment, detecting of residual liquid on the substrate, substrate table, or both is effected by the measuring of the position, till, or both giving a measurement outside a normal operating range. In an embodiment, detecting residual liquid comprises measuring the position of a marker in a direction substantially perpendicular to an optical axis of the projection system. In an embodiment, detecting of residual liquid on the substrate, substrate table, or both is effected by the measuring of the position giving a measurement outside a normal operating range. In an embodiment, detecting residual liquid is performed by one or more devices selected from the group comprising an air gauge, a capacitive sensor, an automatically focusing spot projector, a scatterometer, a camera, an infrared sensor, and a grazing angle laser beam and a detector to detect scattered light. In an embodiment, detecting residual liquid comprises monitoring a force applied by an actuator to maintain the substrate table at a constant vertical position. In an embodiment, projecting the patterned beam of radiation is performed at an exposure station and detecting residual liquid is performed at a measurement station, the measurement station being physically separate from the exposure station. In an embodiment, detecting residual liquid is performed in parallel with projecting the patterned beam.

Figure 4:
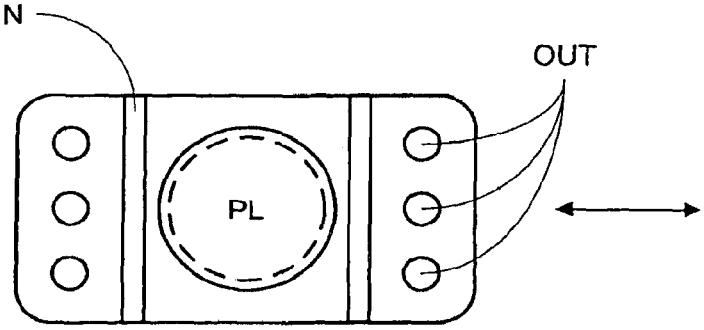
FIG. 4 depicts another liquid supply system for a lithographic projection apparatus.
Figure 4:
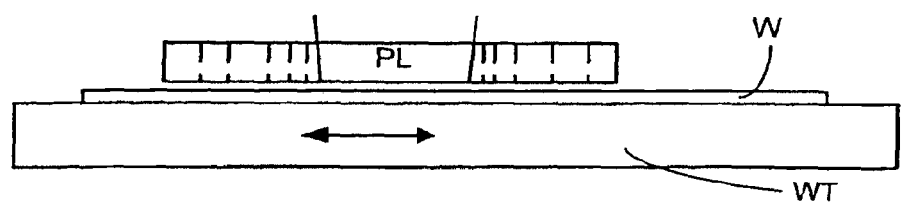

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

The present invention may be applied to any immersion lithography apparatus, in particular, but not exclusively, those types mentioned above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion" respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus comprising:
   a substrate table configured to hold a substrate;
   a projection system arranged to project a patterned beam of radiation onto the substrate;
   a liquid supply system configured to supply a liquid to a space between the projection system and the substrate table; and
   a residual liquid detector configured to detect the liquid on i) the substrate when held by the substrate table, ii) the substrate table, iii) a further movable table of the lithographic apparatus, or iv) any combination selected from i) to iii), wherein the residual liquid detector comprises an alignment sensor configured to detect the liquid or a sensor configured to measure a distance and/or tilt of a solid surface and to detect the liquid.

2. The apparatus of claim 1, wherein the residual liquid detector comprises the sensor configured to measure the distance and/or tilt of the solid surface, the sensor configured to measure the distance of the surface in a direction substantially parallel to an optical axis of the projection system, the tilt of the surface about an axis substantially perpendicular to the optical axis of the projection system, or both.

3. The apparatus of claim 2, wherein detection of the liquid is effected by the sensor configured to measure the distance and/or tilt of the solid surface giving a measurement outside a normal operating range or varying significantly from a previous measurement or reference value.

4. The apparatus of claim 1, wherein the residual liquid detector comprises the alignment sensor, the alignment sensor configured to measure the position of a marker, the position being in a direction substantially perpendicular to an optical axis of the projection system.

5. The apparatus of claim 4, wherein detection of the liquid is effected by the alignment sensor giving a measurement outside a normal operating range or varying significantly from a previous measurement or reference value.

6. The apparatus of claim 1, wherein the residual liquid detector comprises one or more devices selected from: an air gauge, a capacitive sensor, an automatically focusing spot projector, a scatterometer, a camera, an infrared sensor, and/or a laser configured to supply a grazing angle laser beam of radiation and a detector to detect scattered radiation.

7. The apparatus of claim 1, wherein the projection system is provided at an exposure station and the residual liquid detector is provided at a measurement station, the measurement station being physically separate from the exposure station.

8. The apparatus of claim 1, wherein the residual liquid detector is configured to detect residual liquid remaining on the exposed substrate after the exposed portion of the substrate is moved from under the projection system.

9. The apparatus of claim 1, wherein the residual liquid detector is arranged to detect residual liquid in parallel with the projection of the patterned beam by the projection system.

10. The apparatus of claim 1, further comprising a drying station configured to remove the detected liquid in the event that the liquid is detected by the residual liquid detector.

11. The apparatus of claim 1, wherein the residual liquid detector is configured to generate, upon detection of residual liquid, a signal to instruct performance of a drying action.

12. The apparatus of claim 1, wherein the residual liquid detector is configured to detect residual liquid after an exposure of the substrate is completed and before the exposed substrate is developed.

13. A lithographic projection apparatus comprising:
    a projection system arranged to project a patterned beam of radiation onto a substrate;
    a liquid supply system configured to supply a liquid to a space between the projection system and a movable table; and
    a same detector configured to both determine a distance, tilt and/or alignment of a solid object and detect the liquid on the object.

14. The apparatus of claim 13, wherein the object comprises the substrate when held by a substrate table of the lithographic apparatus.

15. The apparatus of claim 13, wherein the object comprises a substrate table of the lithographic apparatus or a further movable table of the lithographic apparatus.

16. The apparatus of claim 13, wherein the detector comprises an alignment sensor, the alignment sensor configured to measure a position of a marker and detect the liquid.

17. The apparatus of claim 13, wherein the detector comprises a level sensor, the level sensor configured to measure a position or orientation of a surface of the object and detect the liquid.

18. The apparatus of claim 13, wherein the detector is configured to emit radiation onto the object and to detect the liquid while there is relative movement between the radiation and the object.

19. A lithographic projection apparatus comprising:
    a projection system arranged to project a patterned beam of radiation onto a substrate;
    a liquid supply system configured to supply a liquid to a space between the projection system and a movable table; and
    a detector configured to detect, after exposure of a surface to the liquid in the space, presence of the liquid on the surface, the detector comprising an alignment sensor or a sensor configured to measure a distance and/or tilt of a solid surface.

20. The apparatus of claim 19, wherein a measurement of a property by the alignment sensor or level sensor that is outside a normal operating range or varies significantly from a previous measurement before application of the liquid to the surface is indicative of the presence of the liquid on the surface.

21. A lithographic projection apparatus comprising:
    a projection system arranged to project a patterned beam of radiation onto a substrate;
    a liquid supply system configured to supply liquid to a space between the projection system and a movable table;
    a radiation output configured to direct a beam of radiation onto or adjacent a surface in the lithographic apparatus, the surface exposed to liquid in the space; and
    a detector configured to detect, after exposure of a surface to the liquid in the space, presence of the liquid on the surface, the detector configured to detect reflected or refracted radiation from the beam and determine, from the detection, the presence of the liquid on the surface, the detector comprising an alignment sensor or a level sensor configured to measure a distance and/or tilt of a solid surface, the alignment sensor or level sensor configured to detect the reflected or refracted radiation in parallel with projection of the patterned beam by the projection system.

* * * * *